US010862436B2

United States Patent
Wang et al.

(10) Patent No.: US 10,862,436 B2
(45) Date of Patent: Dec. 8, 2020

(54) SENSOR BIAS CIRCUIT FOR IMPROVED NOISE PERFORMANCE

(71) Applicant: Analog Devices International Unlimited Company, Limerick (IE)

(72) Inventors: Hanqing Wang, Beijing (CN); John Jude O'Donnell, Quin (IE)

(73) Assignee: Analog Devices International Unlimited Company, Limerick (IE)

( * ) Notice: Subject to any disclaimer, the term of this patent is extended or adjusted under 35 U.S.C. 154(b) by 486 days.

(21) Appl. No.: 15/586,922

(22) Filed: May 4, 2017

(65) Prior Publication Data

US 2018/0323750 A1 Nov. 8, 2018

(51) Int. Cl.
*H03F 1/26* (2006.01)
*H03G 3/20* (2006.01)
(Continued)

(52) U.S. Cl.
CPC ............ *H03F 1/26* (2013.01); *G01N 27/416* (2013.01); *G01N 27/4163* (2013.01); *H03F 3/45475* (2013.01); *H03G 3/20* (2013.01); *H03F 2200/261* (2013.01); *H03F 2200/555* (2013.01); *H03F 2203/45522* (2013.01);
(Continued)

(58) Field of Classification Search
CPC ........... G01N 27/4045; G01N 27/4074; G01N 27/404–407; G01N 27/409; G01N 27/419; G01N 27/41; G01N 33/497; A61B 5/08; A61B 5/097; A61B 5/082; A61M 16/085;
(Continued)

(56) References Cited

U.S. PATENT DOCUMENTS 6,447,670 B1 * 9/2002 Holmstrom ........ G01N 27/4163
204/402
6,554,469 B1 4/2003 Thomson et al.
(Continued)

FOREIGN PATENT DOCUMENTS

CN 101341398 A 1/2009
CN 102706932 A 10/2012
(Continued)

OTHER PUBLICATIONS

"Chinese Application Serial No. 201810419450.2, Office Action dated Dec. 31, 2019", W/O English Translation, 10 pgs.
(Continued)

*Primary Examiner* — Gurpreet Kaur
(74) *Attorney, Agent, or Firm* — Schwegman Lundberg & Woessner, P.A.

(57) ABSTRACT

Techniques for improving noise performance while processing signals received from an electrochemical sensor are provided. In an example, an interface circuit can include a first amplifier configured to provide a voltage to a counter electrode of an electrochemical sensor, a second amplifier configured to receive sensor information from a working electrode of the electrochemical sensor and to provide concentration information using the sensor information. In certain examples, an input of the first amplifier can be directly coupled to an input of the second amplifier to attenuate noise, of either the first amplifier or the second amplifier, within the concentration information provided by the second amplifier.

20 Claims, 7 Drawing Sheets

(51) Int. Cl.
*H03F 3/45* (2006.01)
*G01N 27/416* (2006.01)
*H03G 3/30* (2006.01)

(52) U.S. Cl.
CPC .............. *H03F 2203/45528* (2013.01); *H03F 2203/45591* (2013.01); *H03F 2203/45594* (2013.01); *H03G 3/30* (2013.01)

(58) Field of Classification Search
CPC ........... A61M 2016/102; G01M 15/10; G01M 15/102
See application file for complete search history.

(56) References Cited

U.S. PATENT DOCUMENTS

| | | | |
|---|---|---|---|
| 8,022,771 | B2 | 9/2011 | Neenan et al. |
| 8,791,754 | B2 | 7/2014 | Lyden |
| 9,213,010 | B2 | 12/2015 | Yang et al. |
| 9,933,387 | B1* | 4/2018 | McCanna ............ G01N 27/286 |
| 2006/0267683 | A1* | 11/2006 | Liu ........................ H03F 1/0277 330/51 |
| 2009/0285579 | A1 | 11/2009 | Neenan et al. |
| 2014/0021064 | A1* | 1/2014 | Pratt .................... G01N 27/416 205/775 |
| 2014/0336485 | A1 | 11/2014 | Mujeeb-u-Rahman et al. |
| 2016/0054424 | A1 | 2/2016 | Yang et al. |

FOREIGN PATENT DOCUMENTS

| | | |
|---|---|---|
| CN | 104614568 A | 5/2015 |
| CN | 105466977 A | 4/2016 |
| CN | 106353378 A | 1/2017 |
| TW | 200831890 A | 8/2008 |
| TW | I340827 B | 4/2011 |
| WO | WO-2013/084073 A2 | 6/2013 |

OTHER PUBLICATIONS

"Operating Characteristics and Handling Manual for the NAP-505 Carbon Monoxide Gas Sensor", Nemoto Sensor Engineering Company Ltd., [Online] Retrieved from the Internet: <URL: http://www.nemoto.eu/assets/nap-505-manual.pdf>, (Apr. 2017), 31 pgs.

"Taiwanese Application Serial No. 107115267, Office Action dated Jan. 16, 2019", w/ English Translation, 11 pgs.

"Taiwanese Application Serial No. 107115267, Office Action dated Aug. 13, 2019", W/O English Translation, 8 pgs.

"Taiwanese Application Serial No. 107115267, Response filed Jun. 11, 2019 to Office Action dated Jan. 16, 2019", w/ English Translation of Amended Claims, 27.

* cited by examiner

SENSOR BIAS CIRCUIT FOR IMPROVED NOISE PERFORMANCE

BACKGROUND

Electrochemical sensors can sense various materials, typically in a gas or liquid form, and can provide electrical representations of the concentration of such materials within a sensing environment. Among other applications, chemical concentration information can be used in manufacturing, exploration, safety monitoring, medical diagnostics and therapy, or combinations thereof. Electrochemical sensors can be based on a variety of technologies. Some technologies provide very small signals but at the same time provide reliable, precision information in a very cost efficient manner. Improvements in processing the small signals of such electrochemical sensors can assist in providing further precision and flexibility in using such sensors.

OVERVIEW

Techniques for improving noise performance while processing signals received from an electrochemical sensor are provided. In an example, an interface circuit can include a first amplifier configured to provide a voltage to a counter electrode of an electrochemical sensor, a second amplifier configured to receive sensor information from a working electrode of the electrochemical sensor and to provide concentration information using the sensor information. In certain examples, an input of the first amplifier can be directly coupled to an input of the second amplifier to attenuate noise, of either the first amplifier or the second amplifier, within the concentration information provided by the second amplifier.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized apparatus and methods for reducing noise in sensing circuitry used to control and process signals of an electrochemical sensor. In general, electrochemical sensor use a bias signal to produce a sense signal that include a representation of a chemical concentration within an environment the sensor is sensing. Terminals or electrodes of an electrochemical sensor can include, but are not limited to, a working electrode, a reference electrode and a counter electrode. The working electrode typically responds to the target chemical and can induce either oxidization or reduction of the chemical. The oxidation or reduction process can create current flow indicative of the concentration of the chemical in the sensing environment.

The reference electrode can be used by the sensing circuitry to maintain a fixed potential at the working electrode. For zero-biased sensors, the sensing circuitry can maintain the working electrode and the reference electrode at the same potential. For non-biased sensors, the sensing circuitry can maintain an offset between the reference electrode and the working electrode.

The counter electrode can complete a sensing circuit with the working electrode and the sensing electronics of the sensing circuitry. The counter electrode can induce the opposite chemical process as that of the working electrode, for example, reducing the target chemical if the working electrode is oxidizing and oxidizing the target chemical if the working electrode is reducing. The potential of the counter electrode can be allowed to float and can change as the concentration of the target chemical changes in the sensing environment. In general, the potential of the counter electrode is less important than in biasing the sensor via the counter electrode so as to maintain a desired potential between the reference electrode and the working electrode.

In general, the sensing circuitry can include two amplifiers. A first amplifier can be used to bias the counter electrode using feedback from the reference electrode. A second amplifier, such as a trans-impedance amplifier can be used to convert the current provided via the working electrode to a voltage indicative of the target chemical concentration within the sensing environment. In conventional sensing circuitry, a reference generator can provide a first reference for input to the first amplifier and a second reference for input to the second amplifier. Such a configuration results in noise being generated in the first and second amplifiers and also from the generation of each reference for the first and second amplifiers. In certain examples, the first reference and the second reference can be the same.

Figure 1:
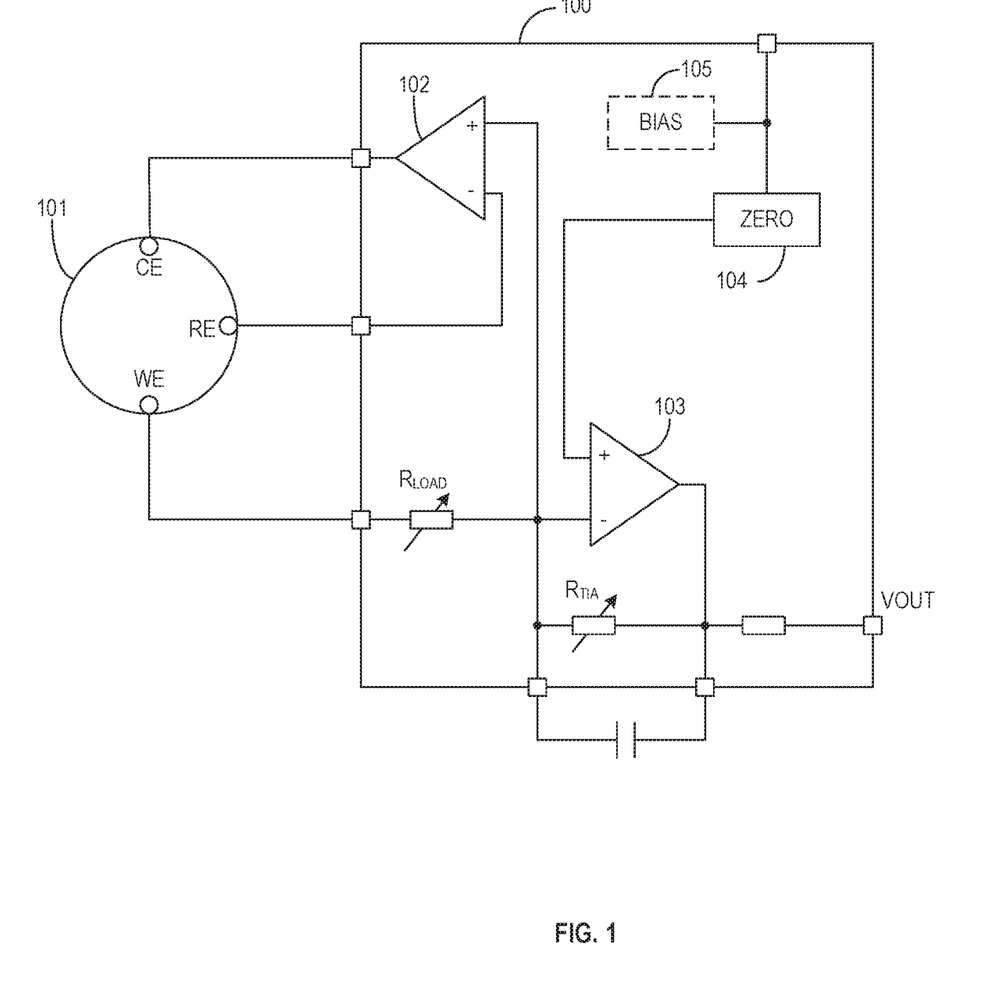
FIG. 1 illustrates an example bias circuit for a zero-bias electrochemical sensor.

FIG. 1 illustrates an example bias circuit 100 for a zero-bias electrochemical sensor 101. The bias circuit 100 can include a first amplifier 102, a second amplifier 103, a reference generator 104 and first and second calibration resistors ($R_{LOAD}$, $R_{TIA}$). In certain examples, the bias circuit 100 can include an optional reference generator 105 for conventional use as discussed above. The first amplifier 102 can bias the counter electrode (CE) and can receive feedback from the reference electrode (RE). The second amplifier 103, in cooperation with a first calibration resistor ($R_{TIA}$), can receive current from the working electrode (WE) and can provide a voltage (VOUT) indicative or representative of a concentration of a target chemical in the sensing environment of the electrochemical sensor 101. Instead of receiving a second reference signal, the non-inverting input of the first amplifier 102 can be connected to the inverting input of the second amplifier 103. Such a connection will provide a reference signal at the first amplifier 102 that is substantially the same as the reference signal (VZERO) provided by the reference generator 104 via the virtual short between the inputs of the second amplifier 103. In addition to eliminating noise associated with the optional reference generator 105, which can be disabled, the noise associated with the second amplifier 103 can be sensed by the first amplifier 102 and can be applied to both sides of the first calibration resistor ($R_{LOAD}$), thus, noise current is not generated from the noise of the second amplifier 103. Noise from the reference generator 104 does not manifest as signal noise current because it appears at both the working electrode (WE) and the reference electrode (RE).

Figure 2:
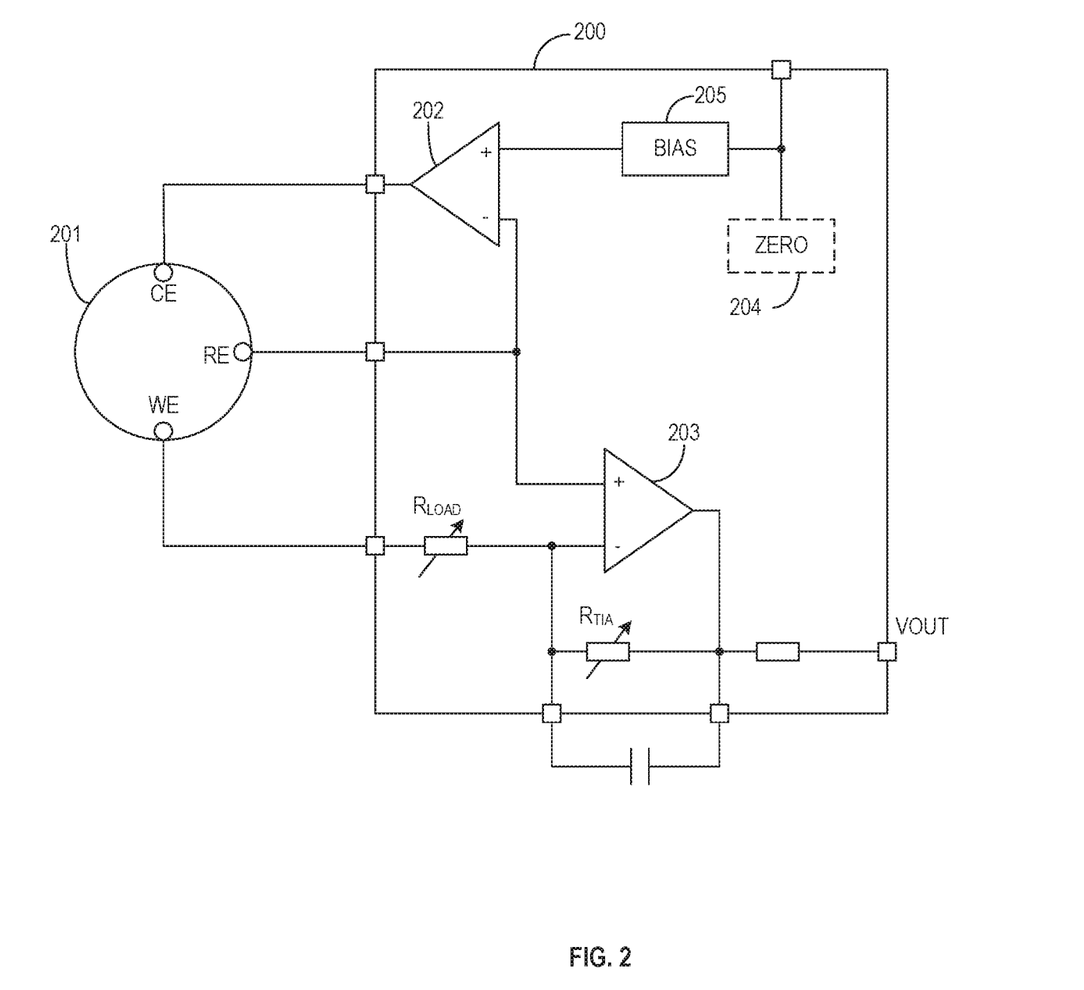
FIG. 2 illustrates an example bias circuit for a zero-bias electrochemical sensor.

FIG. 2 illustrates an example bias circuit 200 for a zero-bias electrochemical sensor 201. The bias circuit 200 can include a first amplifier 202, a second amplifier 203, a reference generator 205 and first and second calibration resistors ($R_{LOAD}$, $R_{TIA}$). In certain examples, the bias circuit 200 can include an optional reference generator 104 for conventional use as discussed above. The first amplifier 202 can bias the counter electrode (CE), can receive feedback from the reference electrode (RE), and can receive a reference voltage (VBIAS) from the reference generator 205. The second amplifier 203 can receive current from the working electrode (WE) and can provide a voltage (VOUT) indicative or representative of a concentration of a target chemical in the sensing environment of the electrochemical sensor 201. Instead of receiving a second reference signal, the non-inverting input of the second amplifier 203 can be connected to the reference electrode (RE). Such a connection can provide a reference signal at the second amplifier 203 that is substantially the same as the reference signal (VBIAS) provided by the reference generator 205 via the virtual short between the inputs of the first amplifier 202. In addition to eliminating noise associated with the optional reference generator 204, which can be disabled, the noise associated with the first amplifier 202 can be sensed by the second amplifier 203 and can be applied to both sides of the first calibration resistor ($R_{LOAD}$), thus, noise current is not generated from the noise of the first amplifier 202. Noise from the reference generator 105 does not manifest as signal noise current because it appears at both the working electrode (WE) and the reference electrode (RE).

Figure 3:
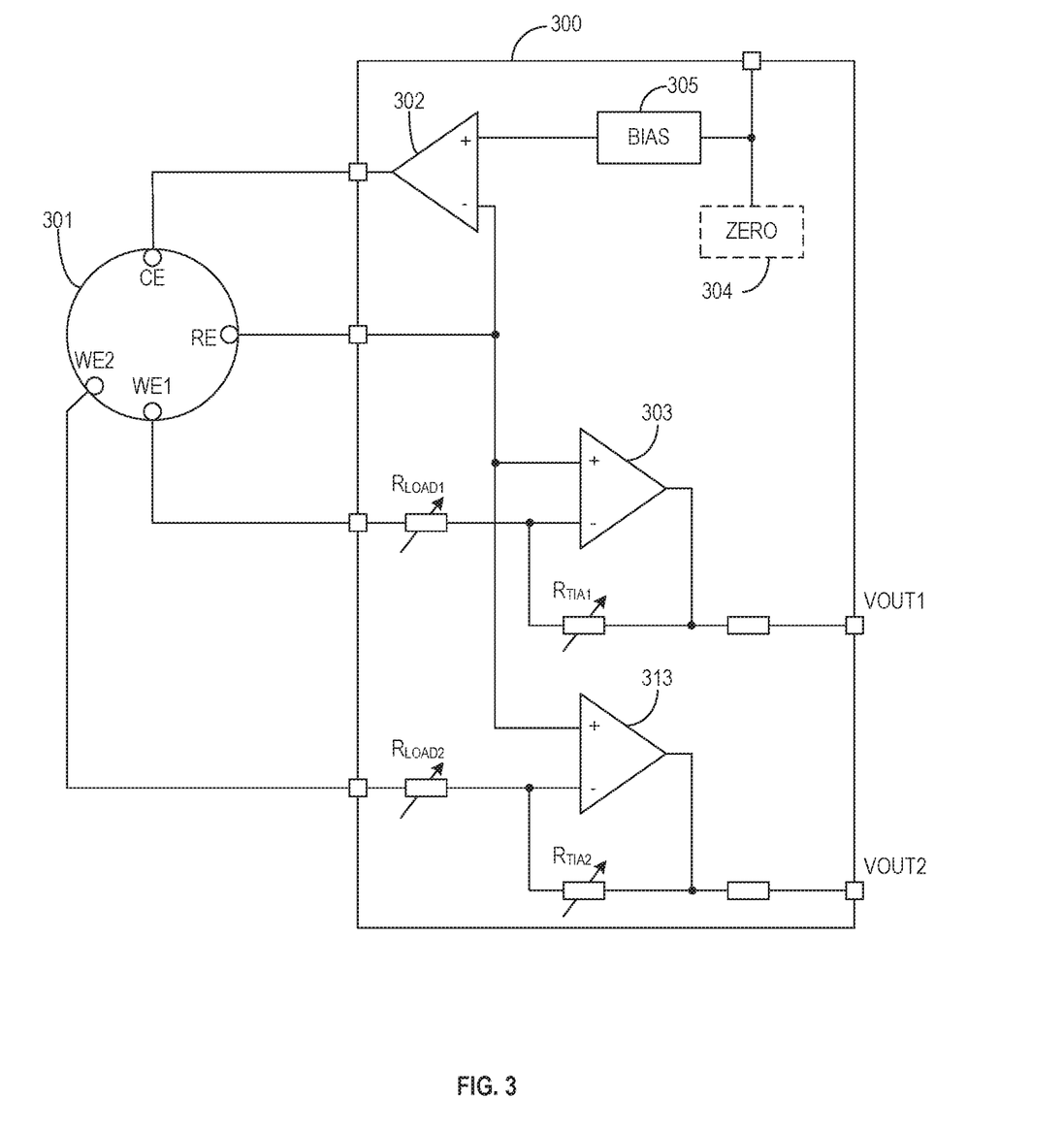
FIG. 3 illustrates an example bias circuit for a zero-bias electrochemical sensor having multiple outputs.

FIG. 3 illustrates an example bias circuit 300 for a zero-bias electrochemical sensor 301 having multiple outputs (WE1, WE2). The bias circuit 300 can include a first amplifier 302, a second amplifier 303, a third amplifier 313, a reference generator 305 and a number of calibration resistors ($R_{LOAD1}$, $R_{TIA1}$, $R_{LOAD2}$, $R_{TIA2}$) including load resistors ($R_{LOAD1}$, $R_{LOAD2}$) associated with each working electrode (WE1, WE2). In certain examples, the bias circuit 300 can include an optional reference generator 304 for conventional use as discussed above. The first amplifier 302 can bias the counter electrode (CE), can receive feedback from the reference electrode (RE) and can receive a reference voltage (VBIAS) from the reference generator 305. The second amplifier 303 can receive current from a first working electrode (WE1) and can provide a first voltage (VOUT1) indicative or representative of a concentration of a first target chemical in the sensing environment of the electrochemical sensor 301. The third amplifier 313 can receive current from a second working electrode (WE2) and can provide a second voltage (VOUT2) indicative or representative of a concentration of a second target chemical in the sensing environment of the electrochemical sensor 301. Instead of receiving a second reference signal, the non-inverting inputs of the second amplifier 303 and the third amplifier 313 can be connected to the reference electrode (RE). Such a connection can provide a reference signal at each of the second amplifier 303 and the third amplifier 313 that is substantially the same as the reference signal (VBIAS) provided by the reference generator 305 via the virtual short between the inputs of the first amplifier 302. In addition to eliminating noise associated with the optional reference generator 304, which can be disabled, the noise associated with the first amplifier 302 can be sensed by each of the second amplifier 303 and the third amplifier 313 and can be applied to both sides of each load resistor ($R_{LOAD1}$, $R_{LOAD2}$), thus, noise current is not generated from the noise of the first amplifier 302. Noise from the reference generator 305 does not manifest as signal noise current because it appears at both the working electrode (WE) and the reference electrode (RE).

Figure 4:
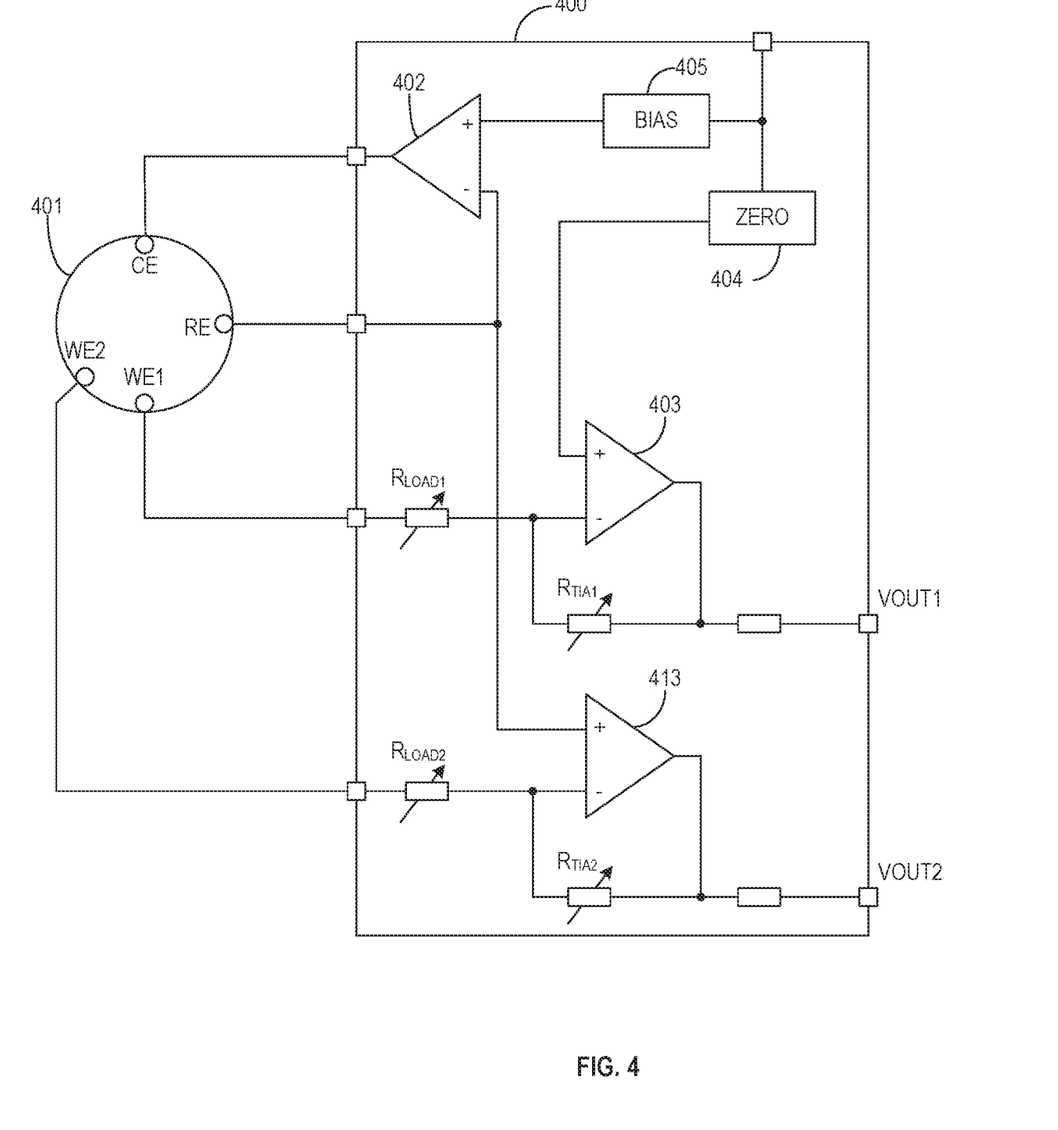
FIG. 4 illustrates an example bias circuit for an electrochemical sensor having multiple outputs.

FIG. 4 illustrates an example bias circuit 400 for an electrochemical sensor 401 having multiple outputs (WE1, WE2). The bias circuit 400 can include a first amplifier 402, a second amplifier 403, a third amplifier 413, a first reference generator 404, a second reference generator 405 and a number of calibration resistors ($R_{LOAD1}$, $R_{TIA1}$, $R_{LOAD2}$, $R_{TIA2}$) including load resistors ($R_{LOAD1}$, $R_{LOAD2}$) associated with each working electrode (WE1, WE2) of the electrochemical sensor 401. The first amplifier 402 can bias the counter electrode (CE), can receive feedback from the reference electrode (RE) and can receive a reference voltage (VBIAS) from the second reference generator 405.

The second amplifier 403 can be configured for a non-zero offset working electrode (WE1) and can receive a reference signal (VZERO) from the first reference generator 404. The second amplifier 403 can receive current from the first working electrode (WE1) and can provide a first voltage (VOUT1) indicative or representative of a concentration of a first target chemical in the sensing environment of the electrochemical sensor 401.

The third amplifier 413 can receive current from a second working electrode (WE2) and can provide a second voltage (VOUT2) indicative or representative of a concentration of a second target chemical in the sensing environment of the electrochemical sensor 401. Instead of receiving a second reference signal, the non-inverting input of the third amplifier 413 can be connected to the reference electrode (RE). Such a connection can provide a reference signal at the third amplifier 413 that is substantially the same as the reference signal (VBIAS) provided by the reference generator 405 via the virtual short between the inputs of the first amplifier 402. The noise associated with the first amplifier 402 can be sensed by each of the third amplifier 413 and can be applied to both sides of the corresponding load resistor ($R_{LOAD2}$), thus, noise current is not generated from the noise of the first amplifier 402. In certain examples, one or more of the calibration resistor ($R_{TIA1}$, $R_{TIA2}$) can operate in cooperation with the respective second amplifier 403 or third amplifier 413 to receive current from the corresponding working electrode (WE1, WE2).

Figure 5:
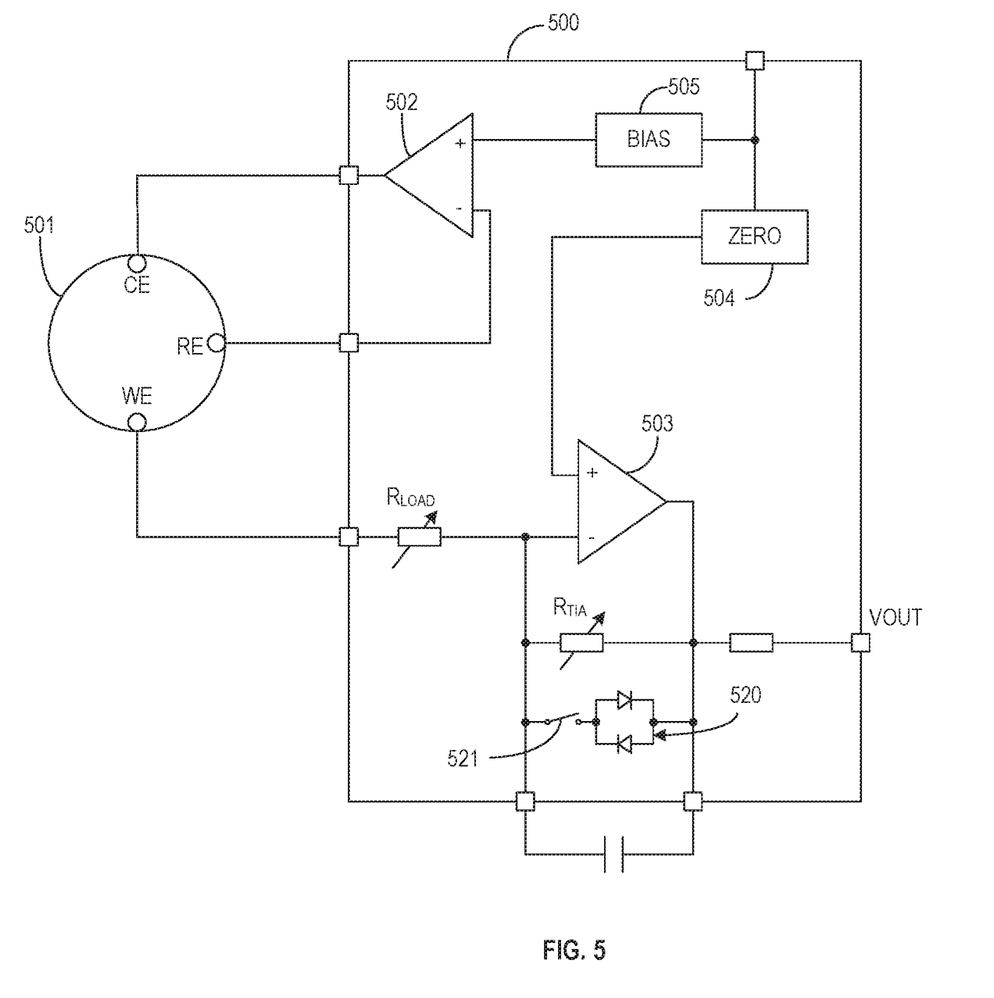
FIG. 5 illustrates generally an example bias circuit that can protect disruption of an electrochemical sensor when the output of the sensor changes quickly.

FIG. 5 illustrates generally an example bias circuit 500 that can protect disruption of an electrochemical sensor 501 when the output of the sensor changes quickly. In certain examples, the bias circuit 500 can include a first amplifier 502, a second amplifier 503, a first reference generator 504, a second reference generator 505 and a number of calibration resistors ($R_{LOAD}$, $R_{TIA}$). In certain examples, an expected operating current range for the electrochemical sensor 501, or a system including the electrochemical sensor 501, can be quite small compared to the capable operating current range of the electrochemical sensor 501 or system.

However, even though an expected operating current range is small, in certain examples, the electrochemical sensor 501 can sense conditions and provide currents that can substantially exceed the expected operating range.

When the electrochemical sensor 501 is expected to provide a small signal range, the calibration resistor providing feedback for the second amplifier 503, the feedback transistor ($R_{TIA}$), can be quite large, resulting in more gain, more output range and, thus, more resolution when converted by an analog-to-digital converter (ADC) for processing. When the electrochemical sensor 501 provides a larger signal than anticipated, in certain examples, the feedback transistor ($R_{TIA}$) can be programmed or reprogrammed, for example, by a controller of the bias circuit 500, to keep the output signal within the input range of the ADC. In certain examples, the reprogrammed information associated with the feedback transistor ($R_{TIA}$) can be passed to the ADC or associated processing circuitry so that the ADC provides properly scaled information indicative of the condition sensed by the sensor ($R_{TIA}$). In some situations, the change from a small signal to the larger signal can happen faster than the change condition can be detected, the feedback resistor ($R_{TIA}$) programmed, and the scaling information passed to the ADC or associated circuitry. In such situations, the second amplifier 503 can be saturated such that the output of the second amplifier 503 is no longer indicative of the condition sensed by the electrochemical sensor 501, control of the working electrode (WE) can be lost, and operation of the electrochemical sensor 501 can be disrupted. In some situations, disruption of the electrochemical sensor 501 can permanently change the operation of the electrochemical sensor 501 or can damage the electrochemical sensor 501.

The example bias circuit 500 of FIG. 5 includes a diode network 520 and a switch 521 coupled in parallel with the feedback transistor ($R_{TIA}$) between an input of the second amplifier 503 and the output of the second amplifier 503. In certain examples, where the feedback resistance ($R_{TIA}$) is large, and the switch 521 is open, a quick increase in sensor current can cause the second amplifier, 503, to saturate causing both a loss of measurement accuracy and disruption of the bias condition of the sensor 501. In certain situations, when the bias condition of the sensor 501 is lost, recovery of a known state of the sensor 501 can take a long time.

In certain examples, when the feedback resistance ($R_{TIA}$) is large, and the switch 521 is closed, the bias circuit 500 can operate such that the switch 521 and diode network 520 have little, if any, effect on the operation of the second amplifier 503. However, upon a quick increase in sensor current, the diode network 520 can allow the second amplifier 503 to maintain correct biasing of the sensor 501. In certain examples, it is understood that a quick increase in sensor current, even with the diode network 520 is active, can cause a temporary loss of measurement accuracy until the system has time to reconfigure the feedback resistance ($R_{TIA}$). It is also understood that the diode network 520 and switch 521 can also be employed in the examples of FIGS. 1-4 without departing from the scope of the present subject matter.

Figure 6:
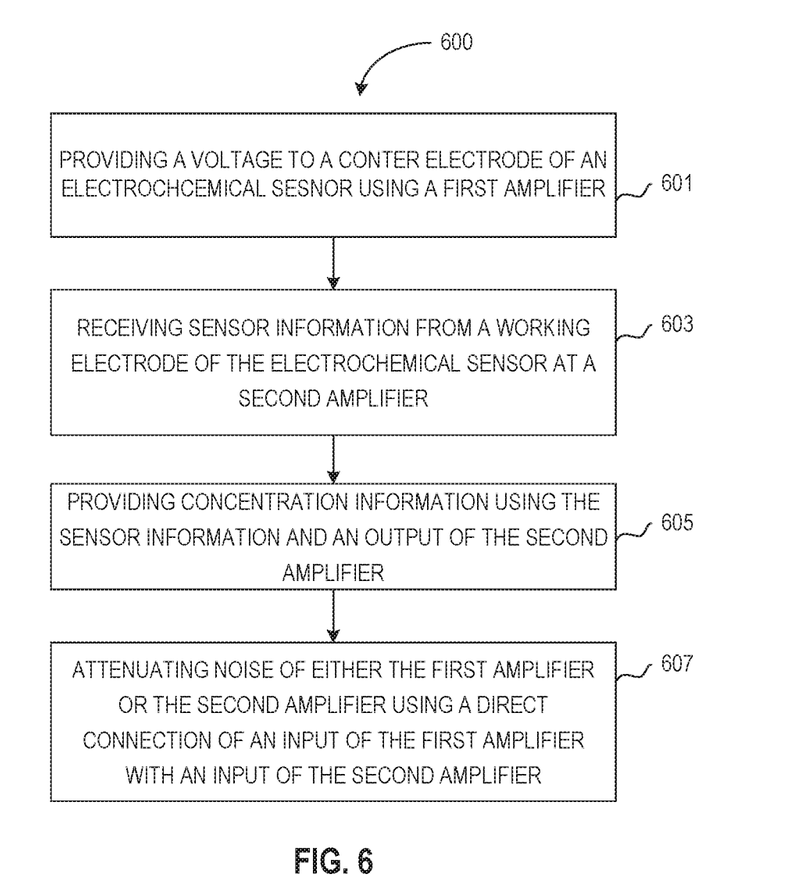
FIG. 6 illustrates generally a flowchart of an example method for improving noise performance of an interface circuit for an electrochemical sensor.

FIG. 6 illustrates generally a flowchart of an example method 600 for improving noise performance of an interface circuit for an electrochemical sensor. At 601, a first amplifier of the interface circuit can provide a voltage to a counter electrode of the electrochemical sensor. At 603, a second amplifier of the interface circuit can receive sensor information from a working electrode of the electrochemical sensor. In certain examples, the electrochemical sensor modifies the current provided at the working electrode so as to provide a representation of a material concentration within the sensing environment. At 605, the second amplifier can provide an indication of the material concentration, such as by amplifying and converting the received current to a voltage indicative of the material concentration. At 607, noise of either the first or second amplifier can be attenuated by connecting an input of the first amplifier to an input of the second amplifier.

Figure 7:
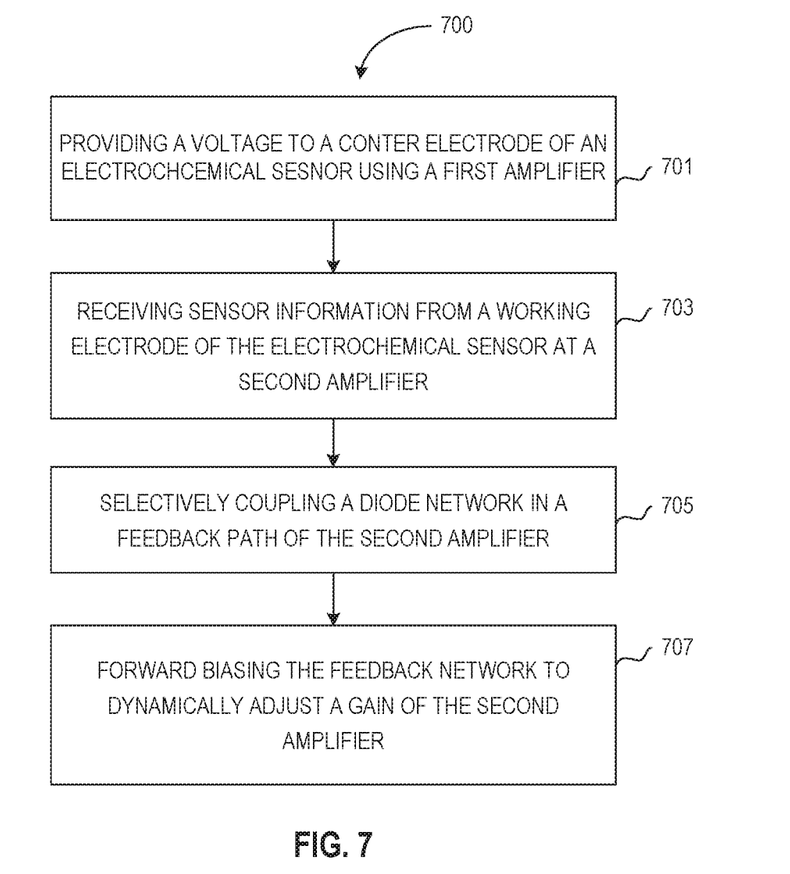
FIG. 7 illustrates generally a flowchart of a method for providing dynamic gain adjustment while processing a signal received from an electrochemical sensor.

FIG. 7 illustrates generally a flowchart of a method 700 for providing dynamic gain adjustment while processing a signal received from an electrochemical sensor. At 701, a first amplifier of the interface circuit can provide a voltage to a counter electrode of the electrochemical sensor. At 703, a second amplifier of the interface circuit can receive sensor information from a working electrode of the electrochemical sensor. In certain examples, the electrochemical sensor modifies the current provided at the working electrode so as to provide a representation of a material concentration within the sensing environment. At 705, selectively coupling a diode network in a feedback path of the second amplifier. In certain examples, when the signal level received from the electrochemical sensor is small, improved sensing resolution can be attained by using higher gain of the second amplifier. Higher gain can be achieved using a large feedback resistance between an input of the second amplifier and an output of the second amplifier. However, using a higher can can allow the second amplifier to saturate if the sensing input to the second amplifier makes a large signal level change. At 707, the diode network can be forward biased to dynamically change the gain of the second amplifier. The forward biasing of the diode network can allow for automatic and quick gain adjustment of the second amplifier which can allow the amplifier to maintain voltage control of the working electrode and prevent disruption of the electrochemical sensor especially during moments when the electrochemical sensor is exposed to unanticipated conditions that would otherwise cause the second amplifier to saturate.

VARIOUS NOTES & EXAMPLES

In Aspect 1, an interface circuit for an electrochemical sensor can include a first amplifier configured to provide a voltage to a counter electrode of the electrochemical sensor, and a second amplifier configured to receive sensor information from a working electrode of the electrochemical sensor and to provide concentration information using the sensor information. An input of the first amplifier can be directly coupled to an input of the second amplifier to attenuate noise, of either the first amplifier or the second amplifier, within the concentration information provided by the second amplifier.

In Aspect 2, the interface circuit of Aspect 1 optionally includes a bias generator having output coupled to an input of the first amplifier.

In Aspect 3, the output of the bias generator of any one or more of Aspects 1-2 optionally is coupled to a non-inverting input of the first amplifier.

In Aspect 4, an inverting input of the first amplifier of any one or more of Aspects 1-3 optionally is directly coupled to the input of the second amplifier.

In Aspect 5, the inverting input of the first amplifier of any one or more of Aspects 1-4 optionally is directly coupled to a non-inverting input of the second amplifier.

In Aspect 6, the input of the first amplifier of any one or more of Aspects 1-5 optionally is configured to couple to a reference electrode of the electrochemical sensor.

In Aspect 7, the interface circuit of any one or more of Aspects 1-6 optionally includes a controller configured to adjust a gain of the second amplifier.

In Aspect 8, the interface circuit of any one or more of Aspects 1-7 optionally includes a load resistance configured to couple the working electrode of the electrochemical sensor to an inverting input of the second amplifier, and a feedback resistance coupled between the output of the second amplifier and the inverting input of the second amplifier.

In Aspect 9, the controller of any one or more of Aspects 1-8 optionally is configured to adjust at least one of the load resistance or the feedback resistance to adjust the gain of the second amplifier.

In Aspect 10, the interface circuit of any one or more of Aspects 1-9 optionally includes a bias generator having output coupled to an input of the second amplifier.

In Aspect 11, the output of the bias generator of any one or more of Aspects 1-10 optionally is coupled to a non-inverting input of the second amplifier.

In Aspect 12, an inverting input of the second amplifier of any one or more of Aspects 1-11 optionally is directly coupled to the input of the first amplifier.

In Aspect 13, the inverting input of the second amplifier of any one or more of Aspects 1-12 optionally is directly coupled to a non-inverting input of the first amplifier.

In Aspect 14, the input of the second amplifier of any one or more of Aspects 1-15 optionally is configured to couple to a reference electrode of the electrochemical sensor.

In Aspect 15, a feedback path of the second amplifier of any one or more of Aspects 1-14 optionally includes a diode network, the diode network configured to dynamically adjust the gain of the second amplifier.

In Aspect 16, an interface circuit for an electrochemical sensor can include a first amplifier having an output configured to couple to a counter electrode of the electrochemical sensor, the first amplifier configured to receive a first bias at a first input and to receive a signal from a reference electrode of the electrochemical sensor at a second input, a second amplifier configured to receive sensor information from a working electrode of the electrochemical sensor at a first input, to receive a second bias at a second input, and to provide concentration information at an output, a feedback path configured to couple the output of the second amplifier to the first input, wherein the feedback path includes a diode network, and wherein the diode network is configured to adjust a gain of the second amplifier.

In Aspect 17, the first bias of any one or more of Aspects 1-16 optionally is equal to the second bias.

In Aspect 18, the first input of the first amplifier of any one or more of Aspects 1-17 optionally is directly coupled to the first input of the second amplifier.

In Aspect 19, the interface circuit of any one or more of Aspects 1-18 optionally includes a bias generator having an output coupled directly to the second input of the second amplifier.

In Aspect 20, the interface circuit of any one or more of Aspects 1-19 optionally includes a bias generator having an output coupled directly to the first input of the first amplifier.

Aspect 21 can include or use, or can optionally be combined with any portion or combination of any portions of any one or more of Aspects 1 through 20 to include or use, subject matter that can include means for performing any one or more of the functions of Aspects 1 through 20, or a machine-readable medium including instructions that, when performed by a machine, cause the machine to perform any one or more of the functions of Aspects 1 through 20.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. 1𝑡 is submitted with the understanding that it will not be used to interpret or limit the scope or meaning of the claims. Also, in the above Detailed The claimed invention is:

1. An interface circuit for an electrochemical sensor, the interface circuit comprising:
   a first amplifier configured to provide a voltage to a counter electrode of the electrochemical sensor;
   a second amplifier configured to receive sensor information from a working electrode of the electrochemical sensor and to provide concentration information using the sensor information; and
   wherein an input of the first amplifier is directly coupled to an input of the second amplifier to attenuate noise, of either the first amplifier or the second amplifier, within the concentration information provided by the second amplifier.

2. The interface circuit of claim 1, including a bias generator having output coupled to a second input of the first amplifier.

3. The interface circuit of claim 2, Therein the output of the bias generator is coupled to a non-inverting input of the first amplifier.

4. The interface circuit of claim 3, wherein the input of the first amplifier is an inverting input and is directly coupled to the input of the second amplifier.

5. The interface circuit of claim 4, wherein the inverting input of the first amplifier is directly coupled to a non-inverting input of the second amplifier.

6. The interface circuit of claim 2, wherein the input of the first amplifier is configured to couple to a reference electrode of the electrochemical sensor.

7. The interface circuit of claim 1, including a controller configured to adjust a gain of the second amplifier.

8. The interface circuit of claim 7, including:
   a load resistance configured to couple the working electrode of the electrochemical sensor to an inverting input of the second amplifier; and
   a feedback resistance coupled between the output of the second amplifier and the inverting input of the second amplifier.

9. The interface circuit of claim 8, wherein the controller is configured to adjust at least one of the load resistance or the feedback resistance to adjust the gain of the second amplifier.

10. The interface circuit of claim 1, wherein the input of the first amplifier is a non-inverting input; and
    wherein the input of the second amplifier is an inverting input.

11. The interface circuit of claim 1, wherein the input of the second amplifier is configured to couple to a reference electrode of the electrochemical sensor.

12. The interface circuit of claim 1, wherein a feedback path of the second amplifier includes a diode network, the diode network configured to dynamically adjust the gain of the second amplifier.

13. An interface circuit for an electrochemical sensor, the interface circuit including:
    a first amplifier having an output configured to couple to a counter electrode of the electrochemical sensor; the first amplifier configured to receive a first bias at a first input and to receive a signal from a reference electrode of the electrochemical sensor at a second input;
    a second amplifier configured to receive sensor information from a working electrode of the electrochemical sensor at a first input, to receive a second bias at a second input, and to provide concentration information at an output;
    a feedback path configured to couple the output of the second amplifier to the first input, wherein the feedback path includes a diode network;
    wherein the diode network includes a switch, a first diode, and a second diode;
    wherein the first and second diode are coupled in parallel with each other;
    wherein an anode of the first diode is coupled to a cathode of the second diode; and
    wherein the diode network is configured to adjust a gain of the second amplifier.

14. The interface circuit of claim 13, wherein the first bias is equal to the second bias.

15. The interface circuit of claim 13, wherein the first input of the first amplifier is directly coupled to the first input of the second amplifier.

16. The interface circuit of claim 14, including a bias generator having an output coupled directly to the second input of the second amplifier.

17. The interface circuit of claim 14, including a bias generator having an output coupled directly to the first input of the first amplifier.

18. An interface circuit for an electrochemical sensor, the interface circuit comprising:
    a first amplifier configured to provide a voltage to a counter electrode of the electrochemical sensor;
    a second amplifier configured to receive sensor information from a working electrode of the electrochemical sensor and to provide concentration information using the sensor information; and
    wherein an inverting input of the first amplifiers directly coupled to a non-inverting input of the second amplifier.

19. The interface circuit of claim 18, wherein the non-inverting input of the second amplifier is configured to couple to a reference electrode of the electrochemical sensor.

20. The interface circuit of claim 18, wherein a feedback path of the second amplifier includes a diode network, the diode network configured to dynamically adjust the gain of the second amplifier.

* * * * *

UNITED STATES PATENT AND TRADEMARK OFFICE
CERTIFICATE OF CORRECTION

PATENT NO. : 10,862,436 B2
APPLICATION NO. : 15/586922
DATED : December 8, 2020
INVENTOR(S) : Wang et al.

Page 1 of 1

It is certified that error appears in the above-identified patent and that said Letters Patent is hereby corrected as shown below:

In the Claims

In Column 9, Line 31, in Claim 3, delete "Therein" and insert --wherein-- therefor In Column 10, Line 11, in Claim 13, delete "sensor;" and insert --sensor,-- therefor In Column 10, Line 49, in Claim 18, delete "amplifiers" and insert --amplifier is-- therefor Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*